United States Patent [19]

Kim

[11] Patent Number: 5,580,811

[45] Date of Patent: Dec. 3, 1996

[54] METHOD FOR THE FABRICATION OF A SEMICONDUCTOR MEMORY DEVICE HAVING A CAPACITOR

[75] Inventor: Jae K. Kim, Kyoungki-do, Rep. of Korea

[73] Assignee: Hyundai Electronics Industries Co., Ltd., Kyoungki-do, Rep. of Korea

[21] Appl. No.: 433,043

[22] Filed: May 3, 1995

[51] Int. Cl.⁶ .......................... H01L 21/70; H01L 27/00
[52] U.S. Cl. ................... 437/52; 437/60; 437/919
[58] Field of Search .................... 437/47, 52, 60, 437/919; 257/301–310

[56] References Cited

U.S. PATENT DOCUMENTS

| | | | |
|---|---|---|---|
| 5,250,457 | 10/1993 | Dennison et al. | 437/52 |
| 5,338,700 | 8/1994 | Dennison et al. | 437/60 |
| 5,409,855 | 4/1995 | Jun | 437/52 |
| 5,432,116 | 7/1995 | Kenm et al. | 457/90 |

OTHER PUBLICATIONS

U.S. patent Application Ser. No. 08/491,702 dated 1995 name to Suk Soo Kim.
U.S. patent Application Ser. No. 08/297,759 dated 1994 name to Kim et al.

*Primary Examiner*—H. Jey Tsai
*Attorney, Agent, or Firm*—Gary M. Nath; Nath & Associates

[57] ABSTRACT

A method for the fabrication of a semiconductor device, capable of reducing the step between the cell region and the peripheral circuit region by forming a storage electrode having a similar height to that of a bit line in a region devoid of the bit line, and of establishing a cylindrical storage electrode without using an additional storage electrode mask by making an etch barrier layer over the bit line serve as a self-aligned etch barrier when a storage electrode contact hole is formed by an etch process using a storage electrode contact hole mask. It can ensure a sufficient allowance of depth of focus for subsequent lithography processes in addition to being simple and improving reliability.

8 Claims, 4 Drawing Sheets

METHOD FOR THE FABRICATION OF A SEMICONDUCTOR MEMORY DEVICE HAVING A CAPACITOR

BACKGROUND OF THE INVENTION

1. Field of the Invention

The present invention relates, in general, to a method for the fabrication of a semiconductor device and, more particularly, to a method for forming a capacitor in a DRAM, capable of relieving the step between the cell region and the peripheral circuit region, thereby securing a sufficient allowance of depth of focus subsequent lithography processes in addition to improving production yield and reliability.

2. Description of the Prior Art

In accordance with the recent trend of high integration in semiconductor devices, in becomes more difficult to form a capacitor with sufficient capacitance as the size of the cell decreases. In order to avoid this difficulty, there has been suggested many solutions. For example, a dielectric with a high dielectric constant or a thin dielectric film is employed in a DRAM device consisting of a MOS transistor and a capacitor, with the aim of increasing the capacitance in the capacitor.

However, these solutions have their own problems. For example, $Ta_2O_5$, $TiO_2$ and $SrTiO_3$, known as dielectrics with a high dielectric constant, have been intensively studied. Nonetheless, these materials are virtually impossible to apply in practice because their reliability, such as junction breakdown voltage, and thin film characteristics are not yet verified. The thinning of thickness of dielectric film is likely to break the dielectric film during the operation of a device, thereby adversely affecting the capacitor.

Apart from this solution for the dielectric, an increase in the surface area of a storage electrode has been suggested with respect to the difficulty in securing sufficient capacitance. For example, in order to increase the surface area of a capacitor, a pin structure in which a plurality of polysilicon layers are connected with one another by a conductive material going through them, or a cylindrical structure is adopted.

In order to better understand the background of the invention, an illustrative description for a conventional semiconductor device adopting a cylindrical capacitor will be given below.

Following establishment of a MOSFET on a semiconductor substrate, an interlayer insulating film is formed on the entire surface of the resulting structure. A bit line is formed in contact with the drain of the MOSFET. Thereafter, a blanket planarization layer with good step coverage, for example, BPSG (boro phospho silicate glass), is furnished upon the resulting structure and then, subjected to etch, to form a contact hole for a storage electrode through which the source of the MOSFET is exposed. A conductive layer is given to bury the contact hole for the storage electrode. Subsequently, a cylindrical, thick oxide film pattern is formed over the contact hole and a cylindrical conductive spacer is formed at the side wall of the oxide pattern. With a mask of both the oxide pattern and the conductive spacer, the conductive layer is etched, so as to leave a conductive layer pattern which still fills the contact hole. Then, the cylindrical, thick oxide film pattern is removed, to complete the formation of a cylindrical storage electrode consisting of the conductive spacer and the conductive layer pattern.

As mentioned above, high integration of a semiconductor device requires that the area occupied by a capacitor be diminished in a semiconductor device. This directs the semiconductor device to the problem of decreasing the capacitance. One conventional solution to the problem is to heighten the storage electrode. However, the towering of a storage electrode brings about higher augmentation of the step between the cell region and the peripheral circuit region, thereby bringing the subsequent processes into difficulties. For example, a lithography process for the formation of metal wiring has difficulty in forming a precise pattern. Accordingly, there is a significant inferiority in production yield and reliability of device operation.

Since the above-illustrated conventional technique uses contact mask and a storage electrode mask separately, the processing becomes complicated and the production yield decreased.

SUMMARY OF THE INVENTION

It is therefore a principal object of the present invention to overcome the above problems encountered in the prior art and to provide a method for the fabrication of a semiconductor device, capable of reducing the step between the cell region and the peripheral circuit region by forming a storage electrode having a similar height to that of a bit line, in a region devoid of the bit line.

It is another object of the present invention to provide the method, capable of establishing a cylindrical storage electrode without using an additional storage electrode mask.

It is a further object of the present invention to provide a simple method for the fabrication of a semiconductor device.

It is still another object of the present invention to provide a method for the fabrication of a semiconductor device, capable of securing a sufficient allowance of depth for subsequent lithography processes.

It is still a further object of the present invention to provide the method, capable of improving production yield and reliability.

Based upon the intensive and thorough study by the present inventors, the above objects could be accomplished by providing a method for the fabrication of a semiconductor device, comprising the steps of: establishing a MOSFET structure consisting of a gate oxide film, a gate electrode, a first insulating film pattern, and a source electrode and a drain electrode on the semiconductor substrate; forming a second insulating film, a first etch barrier layer and a third insulating film upon the entire surface of the resulting structure, in sequence, said first etch layer differing from said third insulating film in etch selection ratio; etching, in sequence, from said third insulating film to said second insulating film by use of a bit line contact mask, to form a bit line contact hole through which the drain electrode is exposed; forming a first insulating spacer at the side wall of said bit line contact hole; depositing a conductive layer for bit line, a fourth insulating film layer and a second etch barrier layer upon the entire surface of the resulting structure, in sequence; etching, in sequence, from said second etch barrier layer to said conductive layer for bit line by use of a bit line mask, to form a bit line, a fourth insulating film and a second etch barrier pattern, respectively; filling the etched portion devoid of said bit line with a fifth insulating film; etching, in sequence, from said fifth insulating film to said second insulating film by use of a storage electrode contact mask, to form a storage electrode contact hole through which said source electrode is exposed; forming a second insulating spacer at the side wall of said storage electrode contact hole; providing a conductive layer pattern along the exposed surface within said storage electrode contact hole, said conductive layer pattern playing a role of a storage electrode; and forming a dielectric film and a plate electrode over said storage electrode, in sequence.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE PREFERRED EMBODIMENTS

Figure 1:
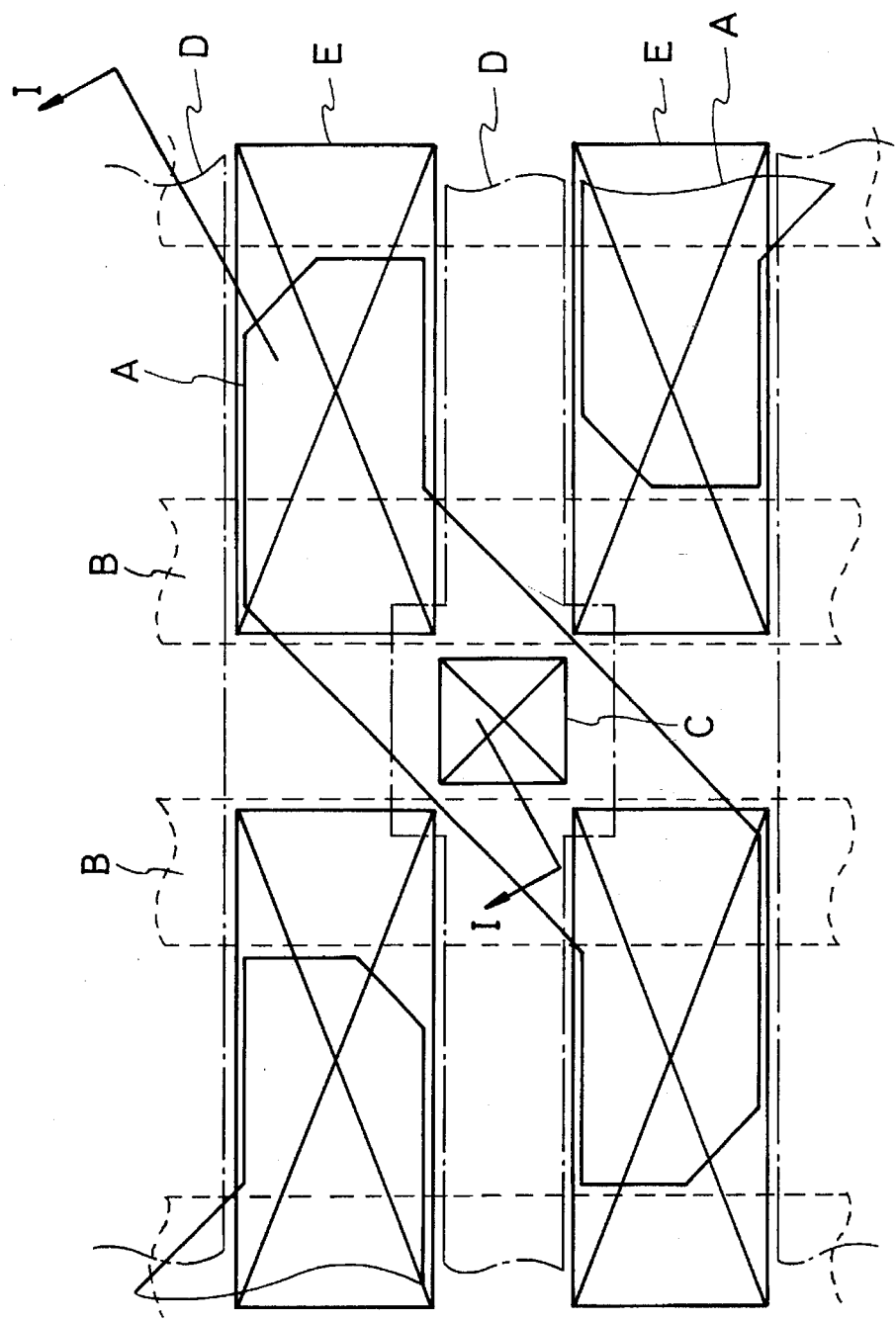
FIG. 1 is a layout showing an arrangement of masks useful in fabricating a semiconductor device, according to the present invention.

The application-of the preferred embodiments of the present invention is best understood with reference to the accompanying drawings, wherein like reference numerals are used for like and corresponding parts, respectively.

Referring to FIG. 1, there is a partial layout, analogous to that of a typical DRAM device, showing an arrangement of masks useful in fabricating a semiconductor device, according to the present invention. As shown in FIG. 1, an active mask A forms an active region zigzag and a plurality of spaced gate lines are longitudinally arranged by gate line masks B, together with a bit line perpendicular to them by a bit line mask D. In the layout, there are storage electrode contact masks E such that each is arranged at an end of the active region, and a bit line contact mask C that is arranged at the center of the active mask A.

It is important to note that any storage electrode mask is not employed separately. As will be described in detail below, the storage electrode contact mask E, similar to the conventional storage electrode mask, is self-aligned by an etch barrier layer below, to form a contact hole through which the source electrode of a MOSFET is exposed.

FIG. 2 shows, through cross sectional views taken through line I—I of FIG. 1, the preferred steps for the fabrication of a semiconductor device, according to one embodiment. These steps are illustrated in connection with FIGS. 2A through 2E.

Figure 2A:
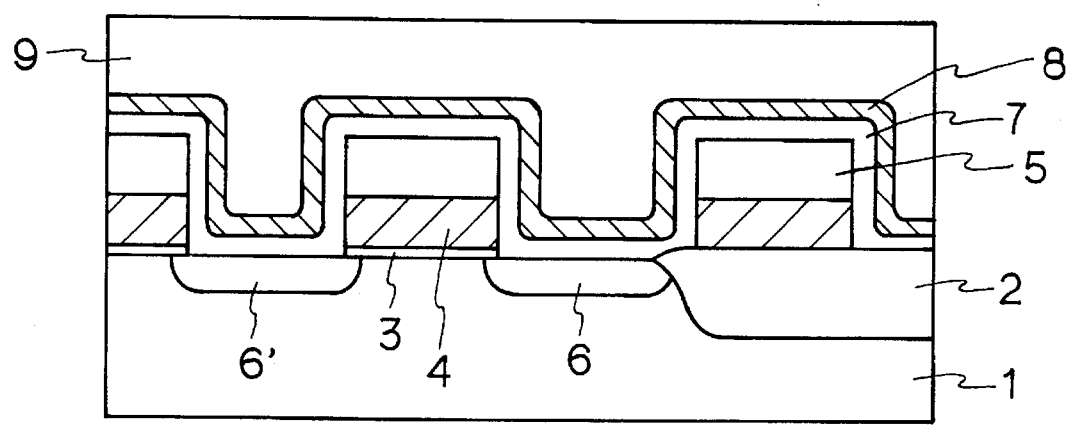
FIGS. 2A through 2E are schematic cross sectional views showing a method for fabricating a semiconductor device, taken through line I—I of FIG. 1.

As shown in FIG. 2A, the method of the present invention starts with the formation of a MOSFET. That is, following formation of an insulating film for element isolation 2 over a predetermined area of a semiconductor substrate 1, a gate oxide layer, a conductive layer for a gate electrode and a first insulating film are entirely deposited, in sequence, over the resulting structure and then etched by use of the gate masks (designated as reference symbol "B" in FIG. 1), to form a gate structure consisting of a gate oxide pattern 3, a gate electrode 4 and a first insulating film pattern 5 and, with a mask of the gate structure, impurities are implanted into the semiconductor substrate 1, to form a source electrode 6 and a drain electrode 6', said impurities being of a different type from that of said semiconductor substrate. Thereafter, the method comprises sequential formation of a relatively thin second insulating film 7, a first etch barrier layer 8 and a blanket third insulating film 9 for planarization upon the MOSFET structure. It is preferred that an oxide film is used for the second insulating film 7, a silicon film for the first etch barrier layer 8 and the a material differing from the first etch barrier layer,in etch selection ratio, for example, BPSG, for the third insulating film 9.

Figure 2B:
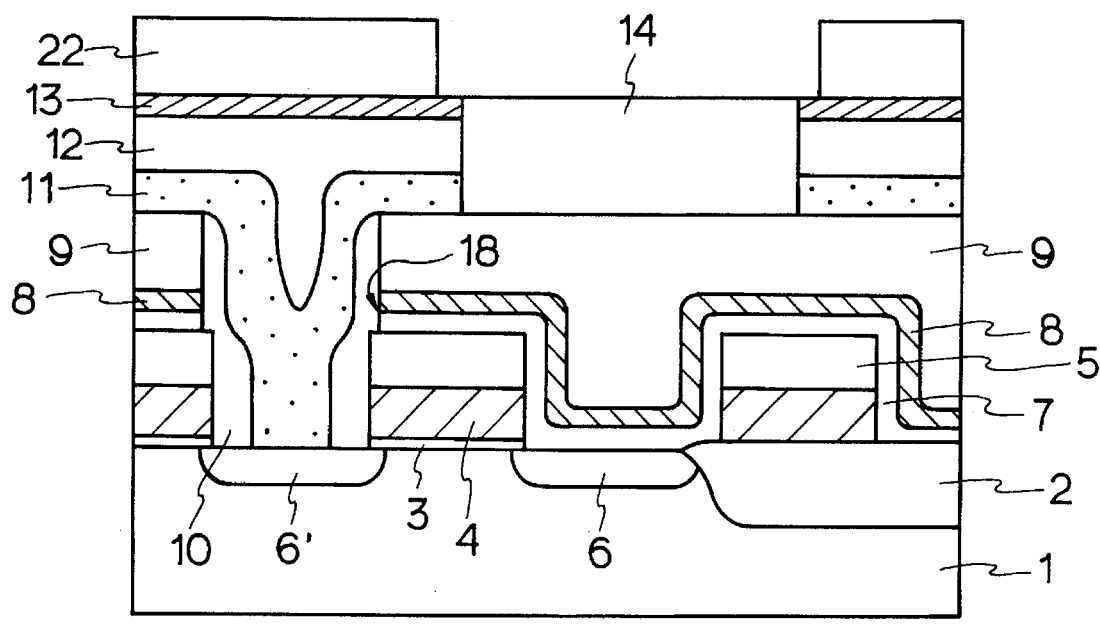

With reference to FIG. 2B, first, from the third insulating film 9 to gate oxide film pattern 3 over the drain electrode 6' is etched, in sequence, by use of the bit line contact mask (designated as reference symbol "C" in FIG. 2B), to form a bit line contact hole 18 through which the drain electrode 6' is exposed. Next, a first insulating spacer 10 is formed at the side wall of the bit line contact hole 18. Thereafter, a conductive layer for a bit line, a fourth insulating film layer for planarization and a second etch barrier layer are deposited upon the entire surface of the resulting structure, in sequence and etched by use of the bit line mask (designated as reference symbol "E" in FIG. 1), to form a bit line 11, a fourth insulating film 12 and a second etch barrier pattern 13, respectively. The etched portion, that is, a region devoid of the bit line 11 is filled with a fifth insulating film 14 of BPSG. A blanket photosensitive film is deposited, exposed to light in the presence of the storage electrode contact mask (designated as reference symbol "E" in FIG. 1) and subjected to development process, to form a photosensitive film pattern 22 through which a predetermined area including the whole fifth insulating film 14 and a nearby part of the second etch barrier layer pattern 13 is exposed.

A material which is different from the third and fourth insulating films 9, 12 in etch selection ratio, for example, a nitride film, is useful for the second etch barrier layer pattern 13. Where a nitride film as the first etch barrier layer 8 is used, the second etch barrier layer pattern 13 may be prepared from a silicon film.

Owing to the second insulating film 7, the first conductive spacer 10 is more thickly formed at the side wall of the gate structure than at the other regions in the contact hole 18.

As for the fifth insulating film 14, a fifth insulating film layer is deposited after completion of the formation of the bit line 11 and then subjected to etch back until the second etch barrier layer pattern 13 is exposed.

Figure 2C:
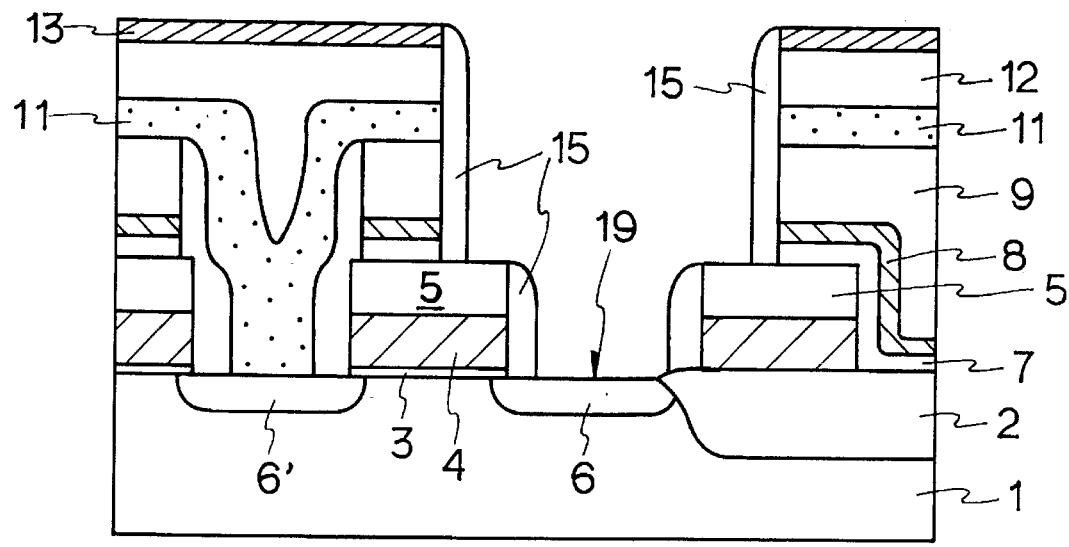

With reference to FIG. 2C, the photosensitive film pattern 22 and the exposed part of the second etch barrier pattern 13 are used as a mask for etching the fifth insulating film and the third insulating film 9, in sequence, followed by etch of the thus exposed area of the first etch barrier layer 8 and the second insulating film 7. As a result, a storage electrode contact hole 19 is formed, exposing the source electrode 6. After the photosensitive film pattern 22 is removed, a second insulating spacer 15 is furnished at the side wall Of the storage electrode contact hole 19.

Figure 2D:
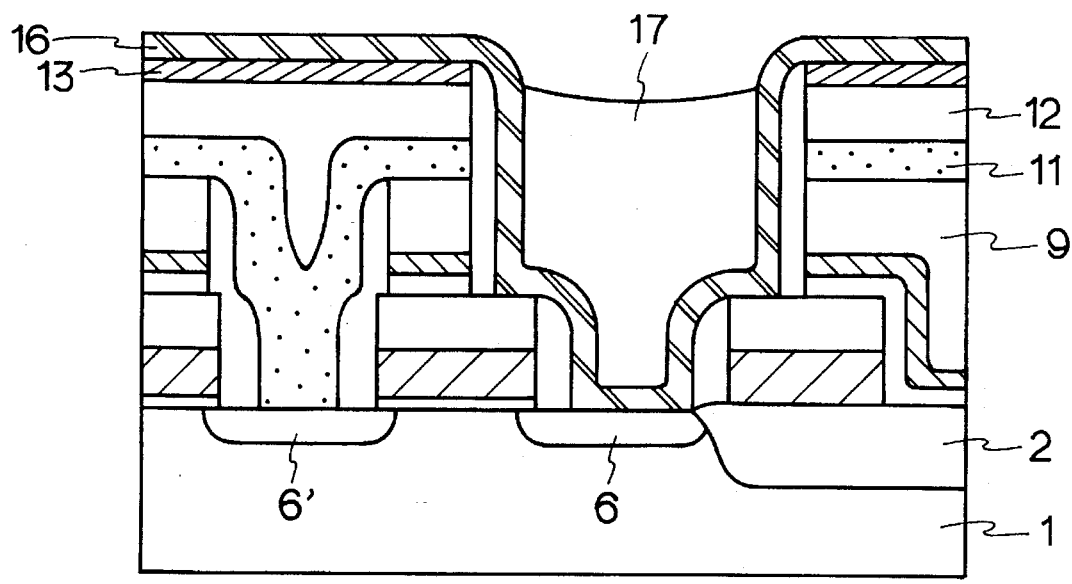

With reference to FIG. 2D, a conductive layer 16 for a storage electrode with a predetermined thickness, for example, a silicon film, is deposited over the entire surface of the resulting structure of FIG. 2C, followed by formation of photosensitive film 17 upon the conductive layer 16 within the storage electrode contact hole 19. In this regard, a blanket photosensitive film is thickly deposited and subjected to etch back, so as to leave it only within the hole.

Figure 2E:
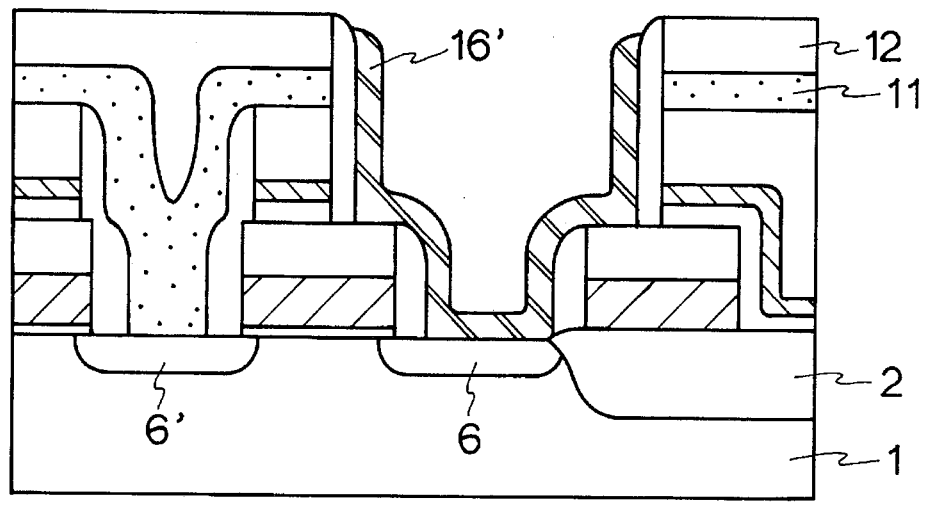

With reference to FIG. 2E, the conductive layer 16 for a storage electrode is selectively etched to form a Storage electrode 16' with the photosensitive film 17 serving as a mask. Then, the photosensitive film 17 and the second etch barrier pattern 13 are taken off. Further processing steps, although not shown, may be undertaken to form a dielectric film upon the surface of the storage electrode 16' and a plate electrode thereupon.

According to the above-illustrated embodiment of the present invention, not only can the storage electrode contact hole be formed in self-alignment by use of the second etch barrier pattern and the storage electrode contact mask, but also the storage electrode can be formed within the contact hole without using a storage electrode mask. Hence, the step becomes much minimized because the difference in height between the storage electrode and the bit line is negligible.

Figure 3:
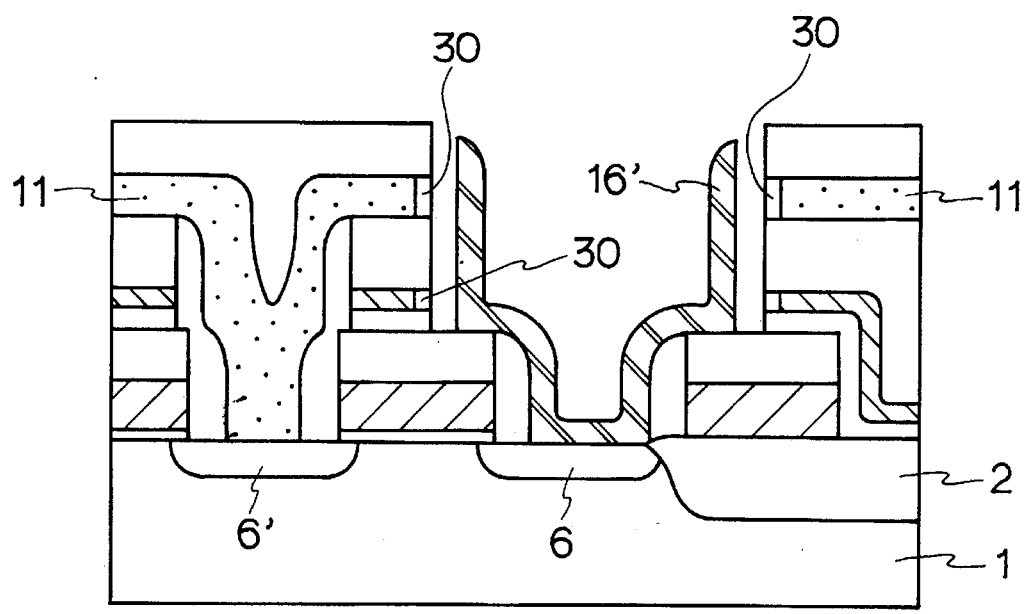
FIG. 3 is a schematic cross-sectioned view of another embodiment of the present invention.

FIG. 3 shows another embodiment of the present invention which is different from the one embodiment in that the second insulating spacer at the outside wall of the storage electrode is removed. As a result, the effective surface area of the storage electrode is augmented. This embodiment will be described in detail, in connection with some of FIG. 2.

Prior to formation of the second insulating spacer 15 in FIG. 2C, the end portion of the bit line 11 which is exposed by forming the storage electrode contact hole 19 is thermally oxidized to form an oxide film 30. And then, the second insulating spacer 15 is formed at the side wall of the contact hole 19. The processes illustrated in FIGS. 2D and 2E are undertaken, so as to form the storage electrode 16'. Finally, the second insulating spacer 15 is removed. Provided that the first etch barrier layer 8 is prepared from a silicon film, its end portion which is exposed owing to the formation of the contact hole 19 is also oxidized during the formation of the oxide film 30. Formation of a dielectric film and a plate electrode upon such Cylindrical storage electrode, whose both surfaces are exposed, results in a capacitor with a significant capacitance.

As described hereinbefore, the step between the cell region and the peripheral circuit region can be quite relieved by forming a storage electrode within a depression devoid of a bit line, in accordance with the present invention. Of course, the even step contributes to making further processing steps, for example, lithography, easy. The second etch barrier pattern over the bit line plays a role of a self-aligned etch barrier when etching by use of the storage electrode contact mask and thus, the contact hole can be as wide as possible within the contact mask. Subsequent lithography processes can be operated with ease. Because the storage electrode is formed without using any storage electrode mask, the number of processes can be reduced, thereby improving productivity.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for fabricating a semiconductor device having one MOSFET and one capacitor on a semiconductor substrate, comprising the steps of:

forming a MOSFET structure having a gate oxide film, a gate electrode, a first insulating film pattern, and a source electrode and a drain electrode on the semiconductor substrate;

forming a second insulating film, a first etch barrier layer and a third insulating film upon an entire surface of the resulting structure after forming said MOSFET structure in sequence, said first etch barrier layer differing from said third insulating film in etch selection ratio;

etching, in sequence, from said third insulating film to said second insulating film by use of a bit line contact mask, to form a bit line contact hole through which the drain electrode is exposed;

forming a first insulating spacer at a side wall of said bit line contact hole;

depositing a conductive layer for a bit line, a fourth insulating film layer and a second etch barrier layer upon an entire surface of the resulting structure after forming said first insulating spacer, in sequence;

etching, in sequence, from said second etch barrier layer to said conductive layer for a bit line by use of a bit line mask, to form stacked pattern consisting of said bit line, said fourth insulating film and said second etch barrier;

filling a gap between said stacked patterns with a fifth insulating film;

etching, in sequence, from said fifth insulating film to said second insulating film by use of a storage electrode contact mask, to form a storage electrode contact hole through which said source electrode is exposed;

forming a second insulating spacer at a side wall of said storage electrode contact hole;

forming a conductive layer pattern along an exposed surface within said storage electrode contract hole, said conductive layer pattern playing a role of storage electrode; and forming a dielectric film and a plate electrode over said storage electrode, in sequence.

2. A method in accordance with claim 1, wherein said first etch barrier layer and said second etch barrier layer are prepared from a nitride film and a silicon layer, respectively.

3. A method in accordance with claim 1, wherein said third and fifth insulating films both are prepared from borophosilicate glass.

4. A method in accordance with claim 1, wherein said step of forming a conductive layer pattern is accomplished by depositing a conductive layer over an entire surface of the resulting structure after the formation of a second insulating spacer, filling a photosensitive film upon the conductive layer within said storage electrode contact hole and etching said conductive layer with said photosensitive film serving as a mask.

5. A method for fabricating a semiconductor device having one MOSFET and one capacitor on a semiconductor substrate, comprising the steps of:

forming a MOSFET structure having a gate oxide film, a gate electrode, a first insulating film pattern, and a source electrode and a drain electrode on the semiconductor substrate;

forming a second insulating film, a first etch barrier layer and a third insulating film upon an entire surface of the resulting structure after forming said MOSFET structure, in sequence, said first etch barrier layer differing from said third insulating film in etch selection ratio;

etching, in sequence, from said third insulating film to said second insulating film by use of a bit line contact mask, to form a bit line contact hole through which the drain electrode is exposed;

forming a first insulating spacer at a side wall of said bit line contact hole;

depositing a conductive layer for a bit line, a fourth insulating film layer and a second etch barrier layer upon an entire surface of the resulting structure after forming said first insulating spacer, in sequence;

etching, in sequence, from said second etch barrier layer to said conductive layer for bit line by use of a bit line mask, to form stacked pattern consisting of said bit line, said fourth insulating film and said second etch barrier;

filling a gap between said stacked patterns with a fifth insulating film;

etching, in sequence, from said fifth insulating film to said second insulating film by use of a storage electrode contact mask, to form a storage electrode contact hole through which said source electrode is exposed;

oxidizing an end portion of said bit line, said end portion being exposed when said storage electrode contact hole is formed;

forming a second insulating spacer at a side wall of said storage electrode contact hole;

forming a conductive layer pattern along an exposed surface within said storage electrode contact hole, said conductive layer pattern playing a role of storage electrode;

removing said second insulating spacer, to expose opposite surfaces of said storage electrode; and forming a dielectric film and a plate electrode over said storage electrode, in sequence.

6. A method in accordance with claim 5, wherein said first etch barrier layer and said second etch barrier layer are prepared from a nitride film and a silicon layer, respectively.

7. A method in accordance with claim 5, wherein said third and fifth insulating films both are prepared from borophosphosilicate glass.

8. A method in accordance with claim 5, wherein said step of forming a conductive layer pattern is accomplished by depositing a conductive layer over an entire surface of the resulting structure after the formation of a second insulating spacer, filling a photosensitive film upon the conductive layer within said storage electrode contact hole and etching said conductive layer with said photosensitive film serving as a mask.

* * * * *